United States Patent [19]
Ishikawa

[11] Patent Number: 5,532,586
[45] Date of Patent: Jul. 2, 1996

[54] METHOD AND APPARATUS FOR DETECTING MAGNETIC DISK DEFECTS USING A COMPLETE DISK ERASURE MAGNET

[75] Inventor: Tetsuro Ishikawa, Kawasaki, Japan

[73] Assignee: Fujitsu Limited, Kawasaki, Japan

[21] Appl. No.: 17,861

[22] Filed: Feb. 16, 1993

[30] Foreign Application Priority Data

Feb. 18, 1992 [JP] Japan .................................... 4-030257

[51] Int. Cl.⁶ ........................... G01R 33/12; G11B 27/36
[52] U.S. Cl. .............................................. 324/212; 360/31
[58] Field of Search ...................... 324/210, 212; 360/31, 53, 66, 25; 365/201; 369/53; 371/10.1, 21.4, 21.1, 21.2, 65

[56] References Cited

U.S. PATENT DOCUMENTS

| | | | |
|---|---|---|---|
| 3,660,727 | 5/1972 | Ohira et al. | 360/66 X |
| 3,686,682 | 8/1972 | Behr et al. | 324/212 X |
| 3,826,975 | 7/1974 | Geller | 324/212 |
| 3,869,713 | 3/1975 | Owens, Jr. | 360/22 X |
| 4,136,373 | 1/1979 | Amos | 360/66 |
| 4,656,420 | 4/1987 | Felleisen et al. | 324/212 |
| 4,703,379 | 10/1987 | Bogdanski | 360/118 |
| 4,746,995 | 5/1988 | Rauskolb | 360/31 |
| 4,829,249 | 5/1989 | Matsushita et al. | 324/212 |
| 4,929,894 | 5/1990 | Monett | 324/212 |
| 4,949,036 | 8/1990 | Bezinque et al. | 324/212 |
| 5,038,321 | 8/1991 | Van Zeghbroeck | 365/106 |
| 5,038,333 | 8/1991 | Chow et al. | 360/78.07 |
| 5,307,218 | 4/1994 | Kitamura et al. | 360/77.08 |
| 5,333,140 | 7/1994 | Moraru et al. | 371/21.2 |

FOREIGN PATENT DOCUMENTS

| | | |
|---|---|---|
| 58-88675 | 5/1983 | Japan . |
| 59-42625 | 3/1984 | Japan . |
| 60-123783 | 7/1985 | Japan . |
| 62-185201 | 8/1987 | Japan . |
| 64-64122 | 3/1989 | Japan . |
| 2-210603 | 8/1990 | Japan . |
| 3-6478 | 1/1991 | Japan . |

*Primary Examiner*—Sandra L. O'Shea
*Assistant Examiner*—Jay M. Patidar
*Attorney, Agent, or Firm*—Greer, Burns & Crain, Ltd.

[57] ABSTRACT

In a method of the present invention, all the information is erased from a magnetic disk in a single revolution, and testing is conducted, for every track, to determine whether or not a defect is present on the magnetic disk. The apparatus includes a magnet for erasing information from the magnetic disk when the magnet is made to face the disk for a predetermined time. Subsequent to erasure the apparatus tests every disk track for defects. Test data is written onto disk tracks using a read/write head. The head is then used to obtain read signals from the data. Thresholds calculated from the read signals are used to determine if defects are present in any of the tracks.

14 Claims, 11 Drawing Sheets

METHOD AND APPARATUS FOR DETECTING MAGNETIC DISK DEFECTS USING A COMPLETE DISK ERASURE MAGNET

BACKGROUND OF THE INVENTION (1) Field of the invention

The present invention relates to a method and apparatus for detecting magnetic disk defects in which the defects can be rapidly detected.

Figure 1A:
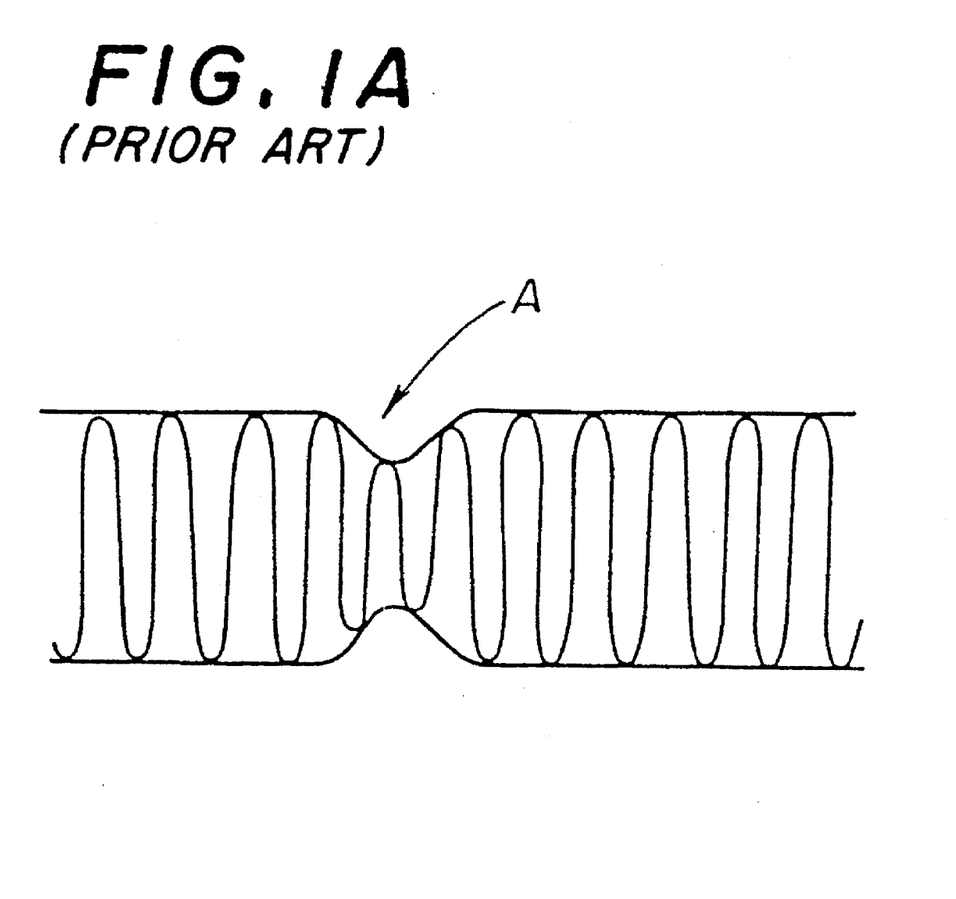
FIGS. 1A and 1B are diagrams illustrating signals corresponding to defects of a magnetic disk.

When data is read out from a magnetic disk having defects, such as minute defects in the magnetic film formed on a base material of the magnetic disk, the amplitude of the read signal rapidly decreases, as shown by symbol A in FIG. 1A. In addition, when there are defects in an area on the magnetic disk from which data is erased, the data is not quite erased from the area and the amplitude of a background signal read out from the area increase sharply to a level greater than the noise level, as shown by symbol B in FIG. 1B. Thus, the magnetic disk defects can be detected based on the above variation of the amplitude of the read signal.

(2) Description of the related art

Figure 2:
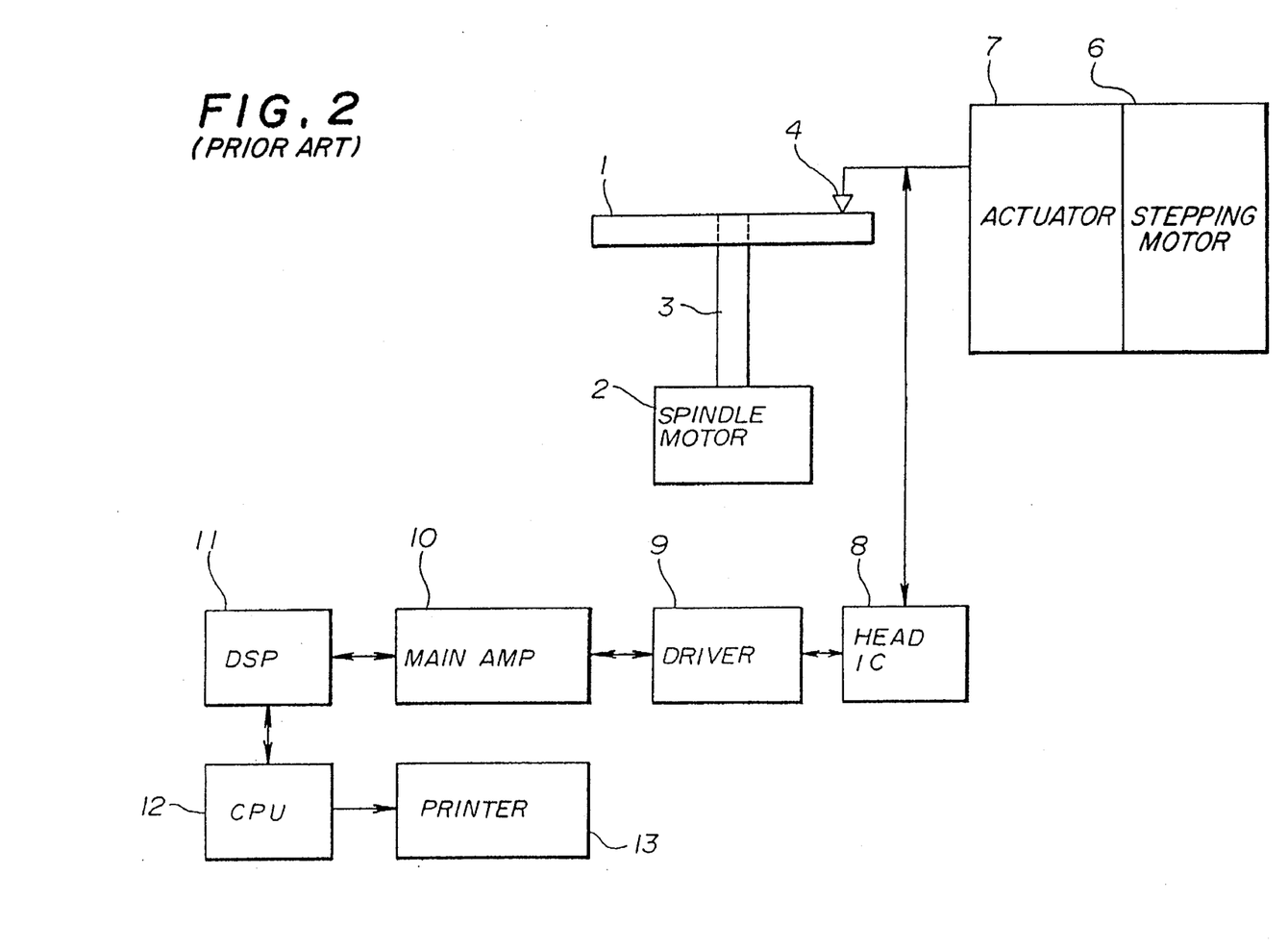
FIG. 2 is a block diagram illustrating a conventional tester for detecting defects of a magnetic disk.

Conventionally, the defects are detected by a tester as shown in FIG. 2.

Referring to FIG. 2, a magnetic disk 1 to be tested is mounted on a spindle shaft 3 rotated by a spindle motor 2. A magnetic head 4 is mounted on an end of an actuator 7 moved by a stepping motor 16. The magnetic head 4 is connected to a head IC 8 so that a read signal output from the magnetic head 4 is supplied to the head IC 8 and a write signal supplied from the head IC 8 is written on the magnetic disk 1 via the magnetic head 4. The head IC 8 is driven by a driver circuit 9. The read signal received by the head IC 8 is transmitted to a defect detecting circuit 11 via the driver circuit 9 and a main amplifier 10. Test data output from the defect detecting circuit 11 is supplied to the head IC 8 via the main amplifier 10 and the driver circuit 9. The test data is supplied, as the write data, from the head IC 8 to the magnetic head 4. A CPU (Central Processing Unit) 12 controls the defect detecting circuit 11. That is, the CPU 12 supplies various instructions and control information to the defect detecting circuit 11 and receives detecting result data generated by the defect detecting circuit 11. The CPU 12 is connected to a printer 13 so that the detecting result data supplied from the defect detecting circuit 11 is printed out by the printer 13.

The defect detecting circuit 11 is formed of a digital signal processor and detects defects of the magnetic disk 1 based on the read signal obtained by the reading of the test data. The defect detecting circuit 11 performs the following processes.

①̂ First process

Test data having a predetermined frequency (e.g. the maximum frequency 2F) is written on the i-th track (i=0,1, . . . ) of the magnetic disk 1.

②̂ Second process

The test data is read out from the i-th track of the magnetic disk 1. Amplitude levels (peak levels) of a read signal obtained from the magnetic head 4 when the test data is read out are averaged for the i-th track, and an average level Av(i) of the read signal for the i-th track is obtained. In addition, it is checked whether or not a missing-pulse is generated. The missing-pulse is generated when the amplitude of the read signal is less than a predetermined threshold level $TH_H$.

That is, when the amplitude of the read signal rapidly decreases as shown in FIG. 1A, the missing-pulse is to be generated. The threshold level $TH_H$ is decided based on the average level Av(i−1) which has already been obtained in the (i−1)-th track. The threshold level $TH_H$ is, for example, 65% of the average amplitude level Av(i−1). By this process, a defect in the i-th track can be detected.

③̂ Third process

The test data is erased from the i-th track of the magnetic disk 1.

④̂ Fourth process

Figure 1B:
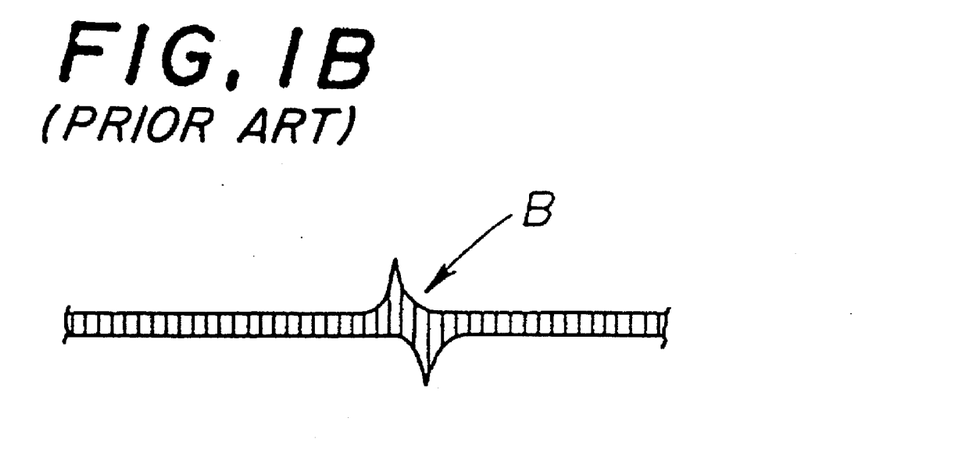

A signal (a background signal) is read out from the i-th track from which the test data has been erased. It is checked whether or not an extra-pulse is to be generated. The extra-pulse is generated when the amplitude of the background signal is greater than a predetermined threshold level $TH_L$. That is, when the amplitude of the background signal rapidly exceeds the noise level, as shown in FIG. 1B, the extra-pulse is generated. The threshold level $TH_L$ is decided based on the average level Av(i) which has already been obtained for the i-th track. The threshold level $TH_L$ is, for example, 25% of the average amplitude level Av(i). By this process, a defect in the i-th track can be detected.

⑤̂ Fifth process

A seek operation is performed so that the magnetic head 4 moves from the i-th track to the (i+1)-th track.

After this, the processes ①̂ through ⑤̂ (one cycle) are repeated until the processes for the last track of the magnetic disk 1 are completed.

Figure 3:
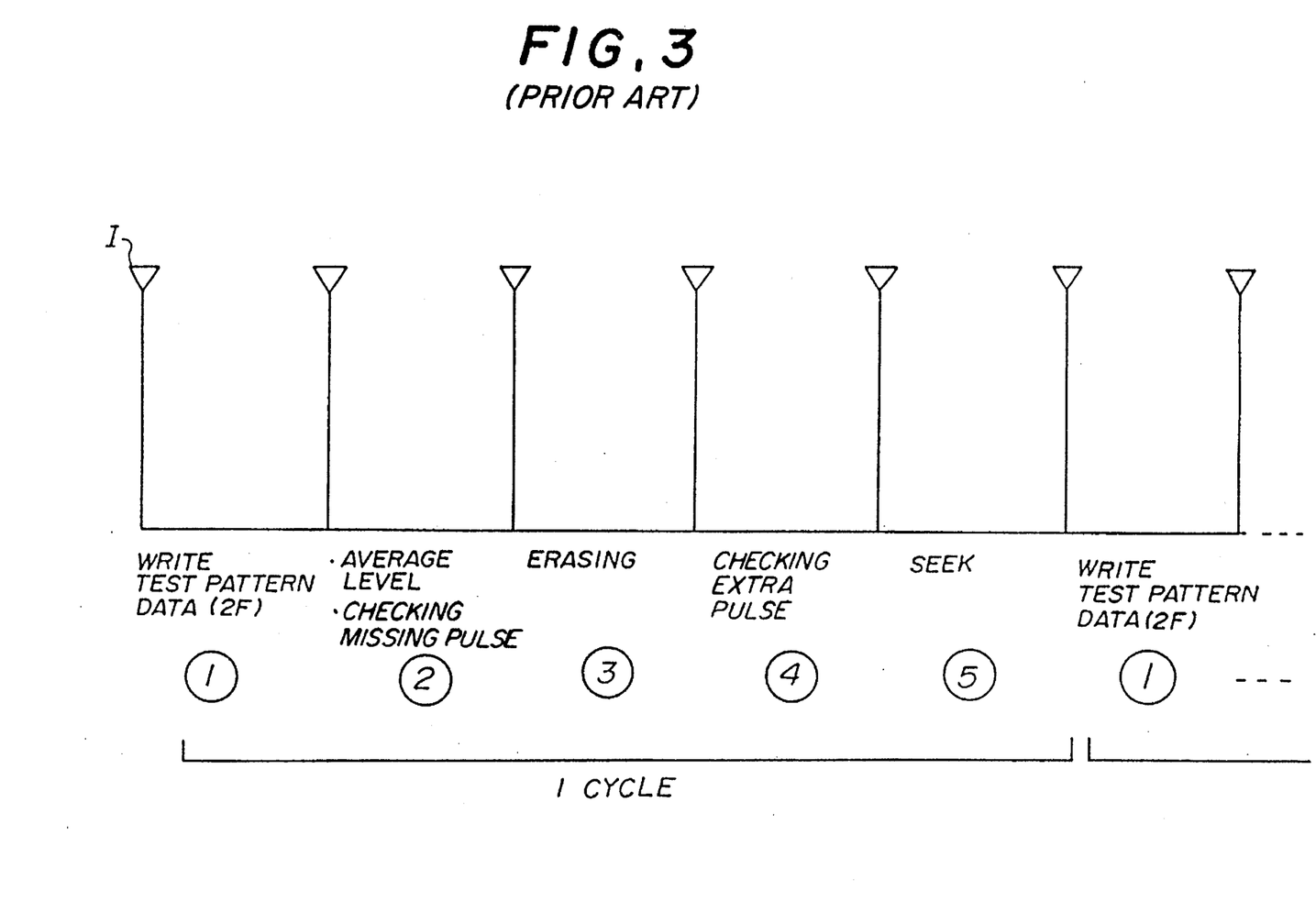
FIG. 3 is a diagram illustrating processes for detecting the defects of the magnetic disk and the number of revolutions of the magnetic disk.

Each of the above processes requires one revolution of the magnetic disk 1. Thus, to detect a defect in one track, the magnetic disk 1 must be rotated by at least five revolutions, as shown in FIG. 3. In FIG. 3, a symbol I indicates an index of a track and the axis of abscissas indicates the number of revolutions of the magnetic disk 1. In addition, the erasing of the test data must be performed, for every track, to check the extra-pulse.

SUMMARY OF THE INVENTION

Accordingly, a general object of the present invention is to provide a novel and useful method and apparatus for detecting defects of a magnetic disk in which the disadvantages of the aforementioned prior art are eliminated.

A more specific object of the present invention is to provide a method for detecting defects of a magnetic disk in which method the processing time can be decreased.

The above objects of the present invention are achieved by a method for detecting defects of a magnetic disk comprising the steps of: (a) erasing the whole magnetic disk; and (b) testing, for every track, whether or not a defect is present on the magnetic disk, after the step (a).

Another object of the present invention is to provide an apparatus for detecting defects of a magnetic disk in which apparatus the defects can be rapidly detected.

The above objects of the present invention are achieved by an apparatus for detecting defects of a magnetic disk comprising: erasing means for erasing the whole magnetic disk; and testing means for testing, for every track, whether or not a defect is present on the magnetic disk from which the information is erased by the erasing means.

According to the present invention, before it is tested, for every track, whether or not a defect is present on the magnetic disk, all the information is erased from the magnetic disk. Thus, when it is tested whether or not a defect is present on the magnetic disk, it is not necessary to erase the information on every track. Thus, the processing time can be improved.

Additional objects, features and advantages of the present invention will become apparent from the following detailed description when read in conjunction with the accompanying drawings.

DESCRIPTION OF THE PREFERRED EMBODIMENT

A description will now be given, with reference to FIG. 4A and 4B, of the principle of an embodiment of the present invention.

Figure 4A:
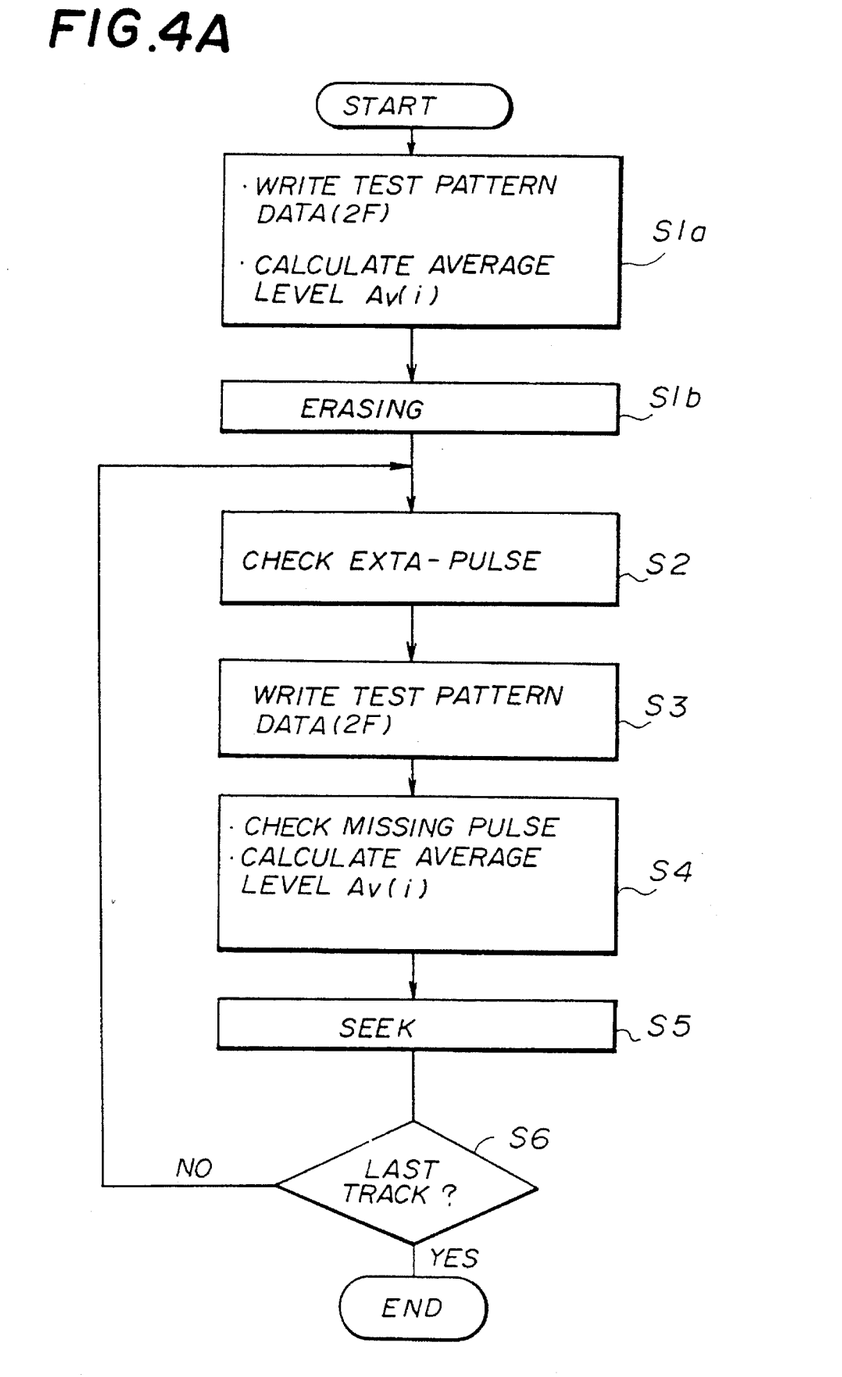
FIGS. 4A and 4B are diagrams illustrating the principle of an embodiment of the present invention.
Figure 4B:
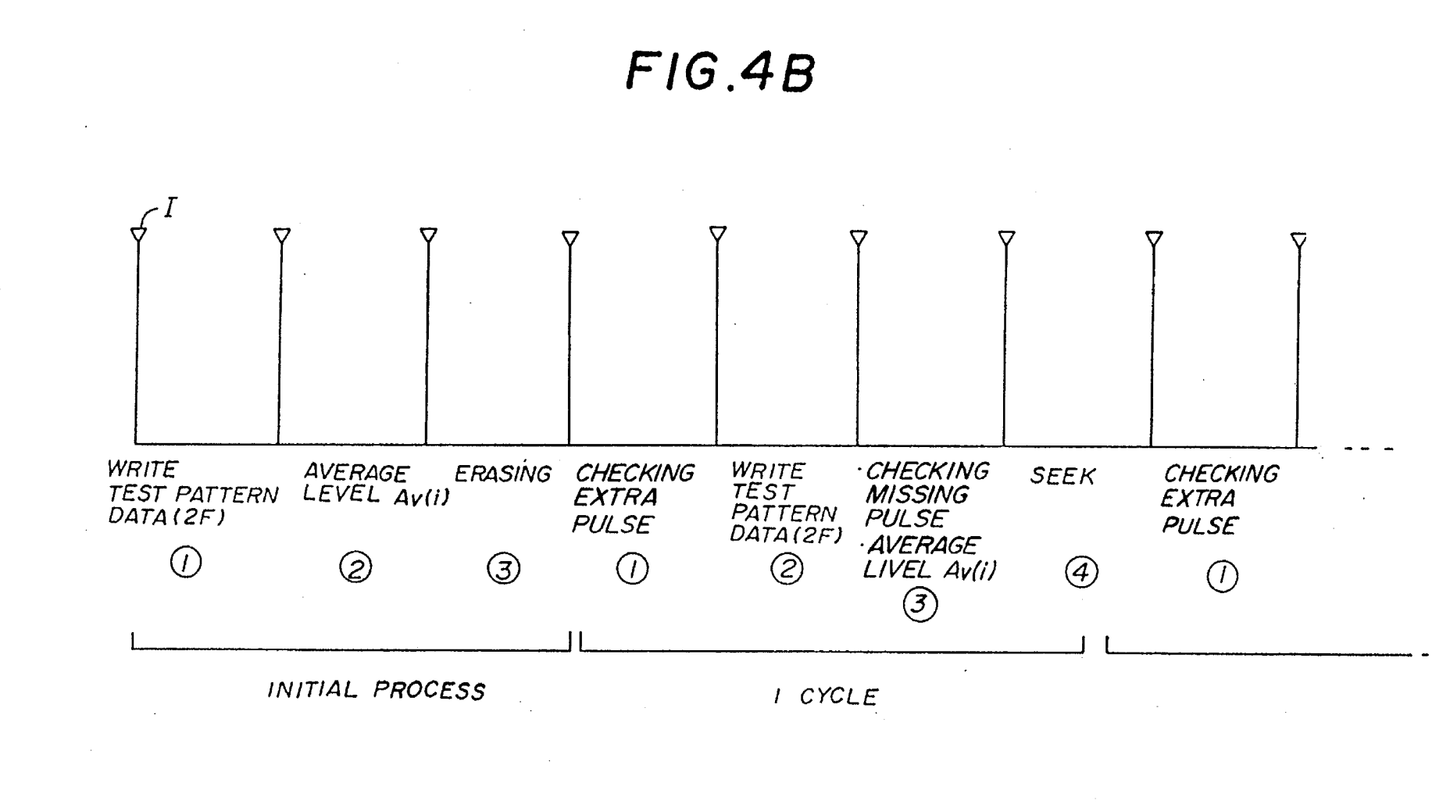

Referring to FIG. 4A, in step S1$a$, test pattern data having a predetermined frequency is written on a track of a magnetic disk, and an average level of a read signal corresponding to the test pattern data is obtained. In step S1$b$, all the information is erased from the magnetic disk. After this, in step S2, it is checked, whether or not an extra-pulse is to be generated, based on a first threshold level corresponding to the average level obtained by step S1$b$. In step S3, the test pattern data having the predetermined frequency is written on the track. In step S4, it is checked, for the track on which the test pattern data has been written in step S3, whether or not a missing-pulse is to be generated based on a second threshold level corresponding to the average level obtained by step S1$a$, and the average level of the read signal corresponding to the test pattern data written in step S3 is obtained. In step S5, a seek operation is performed so that the magnetic head moves to the next track. In step S6, it is determined whether or not the track is the last track of the magnetic disk. In a case where the track is not the last track of the magnetic disk, steps S2 through S6 are performed again. That is, steps S2 through S6 are cyclically repeated until steps for the last track are completed. The average level obtained in step S4 is used for generating the extra-pulse in step S2 and used for generating the missing-pulse in step S4 in the next cycle. According to the embodiment of the present invention, after an initial process including steps S1$a$ and S1$b$ is completed, four processes 1̂ through 4̂ (one cycle) as shown in FIG. 4B are repeated.

A description will now be given, with reference to FIGS.5 through 8B, of the embodiment of the present invention.

Figure 5:
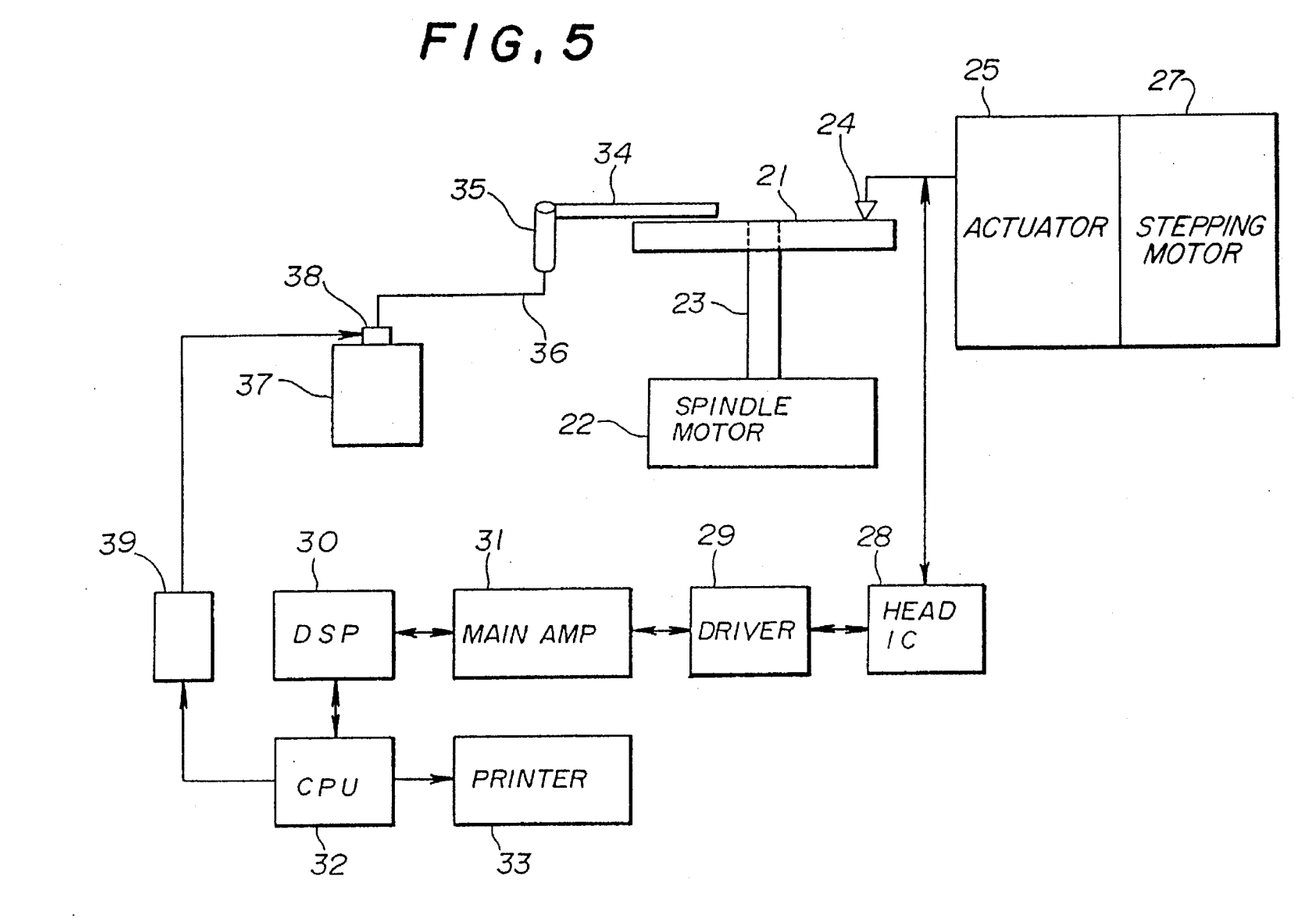
FIG. 5 is a block diagram illustrating a tester according to the embodiment of the present invention.

A tester for detecting defects of a magnetic disk is structured as shown in FIG. 5. Referring to FIG. 5, a magnetic disk 21 to be tested is mounted on a spindle shaft 23 of a spindle motor 22, so that the magnetic disk 21 is rotated at a constant speed in the same manner as that of the conventional tester shown in FIG. 2. A magnetic head 24 is mounted on an actuator 25. Test pattern data is written to and read from the magnetic disk 21 via the magnetic head 24. The actuator 25 is moved by a stepping motor 27 when the seek operation of the magnetic head 24 is performed. Signals output from the magnetic head 24 are supplied to a digital signal processor (DSP) 30 via a head IC 28. A driver circuit 29 and a main amplifier 31 operate in the same manner as those in the conventional tester shown in FIG.2. The test pattern data output from the digital signal processor (DSP) 30 is supplied to the magnetic head 24 via the main amplifier 31, the driver circuit 29 and the head IC 28, and written to the magnetic disk 21 via the magnetic head 24. The head IC 28 drives the magnetic head 24 in the reading and writing operations and amplifies signals. The driver circuit 29 includes a pre-amplifier and a selector circuit. A CPU 32 controls the digital signal processor 30 to detect defects of the magnetic disk 21. The CPU 32 also controls a printer so that test results are printed out by the printer 33.

Figure 6:
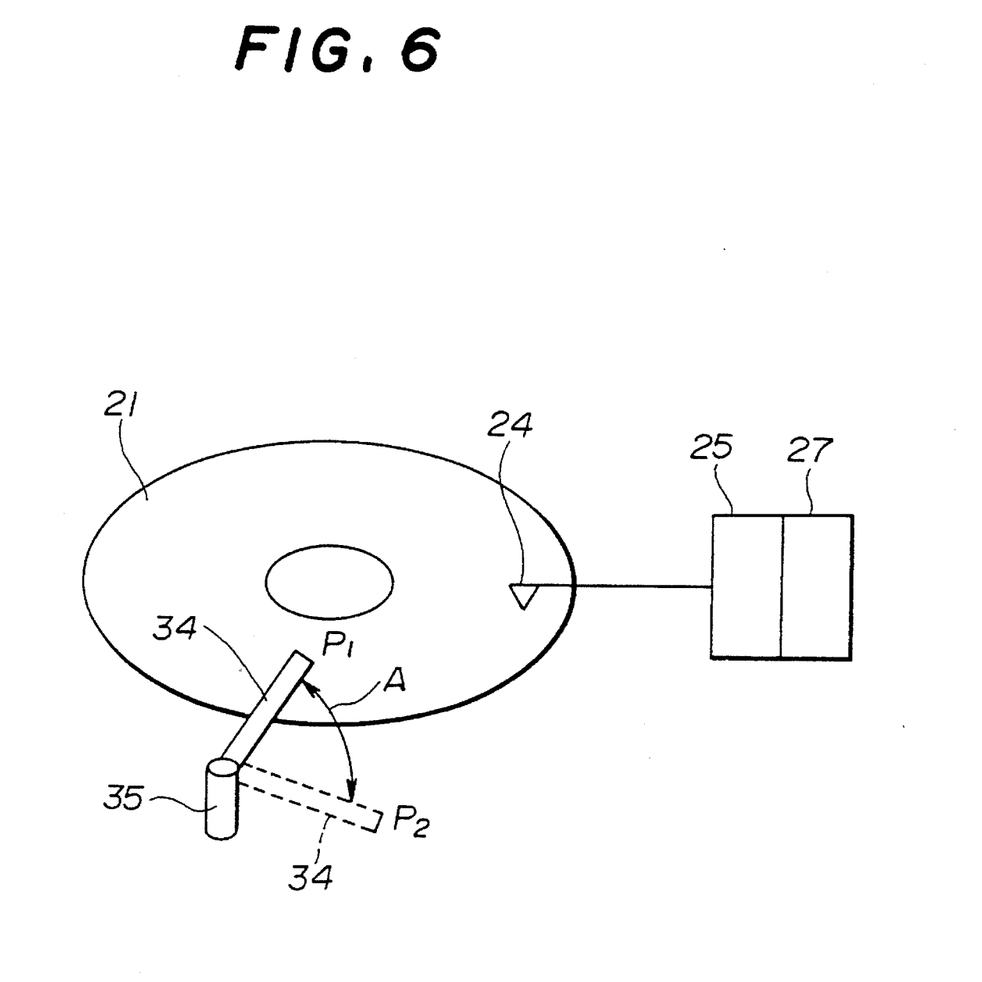
FIG. 6 is a diagram illustrating a mechanism for erasing test pattern data from the magnetic disk.

The tester is provided with a magnet rod 34 facing the surface of the magnetic disk 21. The magnet rod 34 is used for erasing information of the whole magnetic disk 21. An end of the magnet rod 34 is fixed on an air cylinder 35. The magnet rod 34 can be pivoted around an axis of the air cylinder 35 within a predetermined region A as shown in FIG. 6. An air supply source 37 is connected to the air cylinder 35 via a solenoid valve 38 and an air pipe 36. When the solenoid valve 38 is turned on, the air pressure is applied from the air supply source 37 to the air cylinder 35 via the air pipe 36. As a result, the magnet rod 34 is moved to a first position P1 (see FIG. 6) by the air cylinder 35, at which position the magnetic rod 34 faces the surface of the magnetic disk 21. On the other hand, when the solenoid valve 38 is turned off, the air pressure from the air supply source 37 is interrupted. As a result, the magnet rod 34 is returned to a second position P2 (see FIG. 6) at which the magnet rod 34 does not face the surface of the magnetic disk 21. The solenoid valve 38 is turned on and off by a driving signal which is supplied from a driver circuit 39 in accordance with instructions from the CPU 32.

The space between the magnet rod 34 and the surface of the magnetic disk 21 is small enough to cause the erasure of all the information from the magnetic disk 21.

Figure 7A:
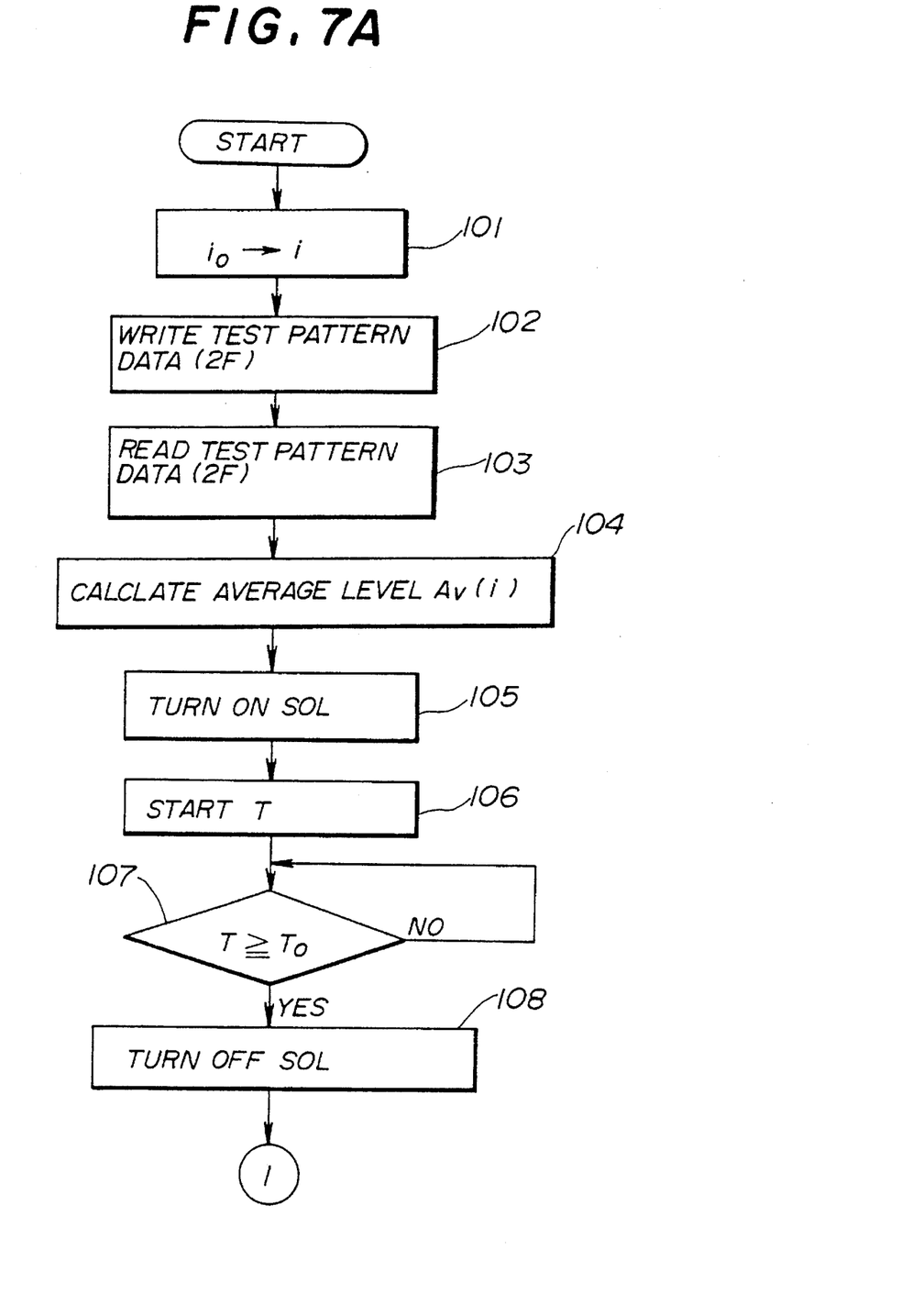
FIGS. 7A and 7B are flow charts illustrating processes for detecting the defects of the magnetic disk, which processes are executed by the tester shown in FIG. 6.
Figure 7B:
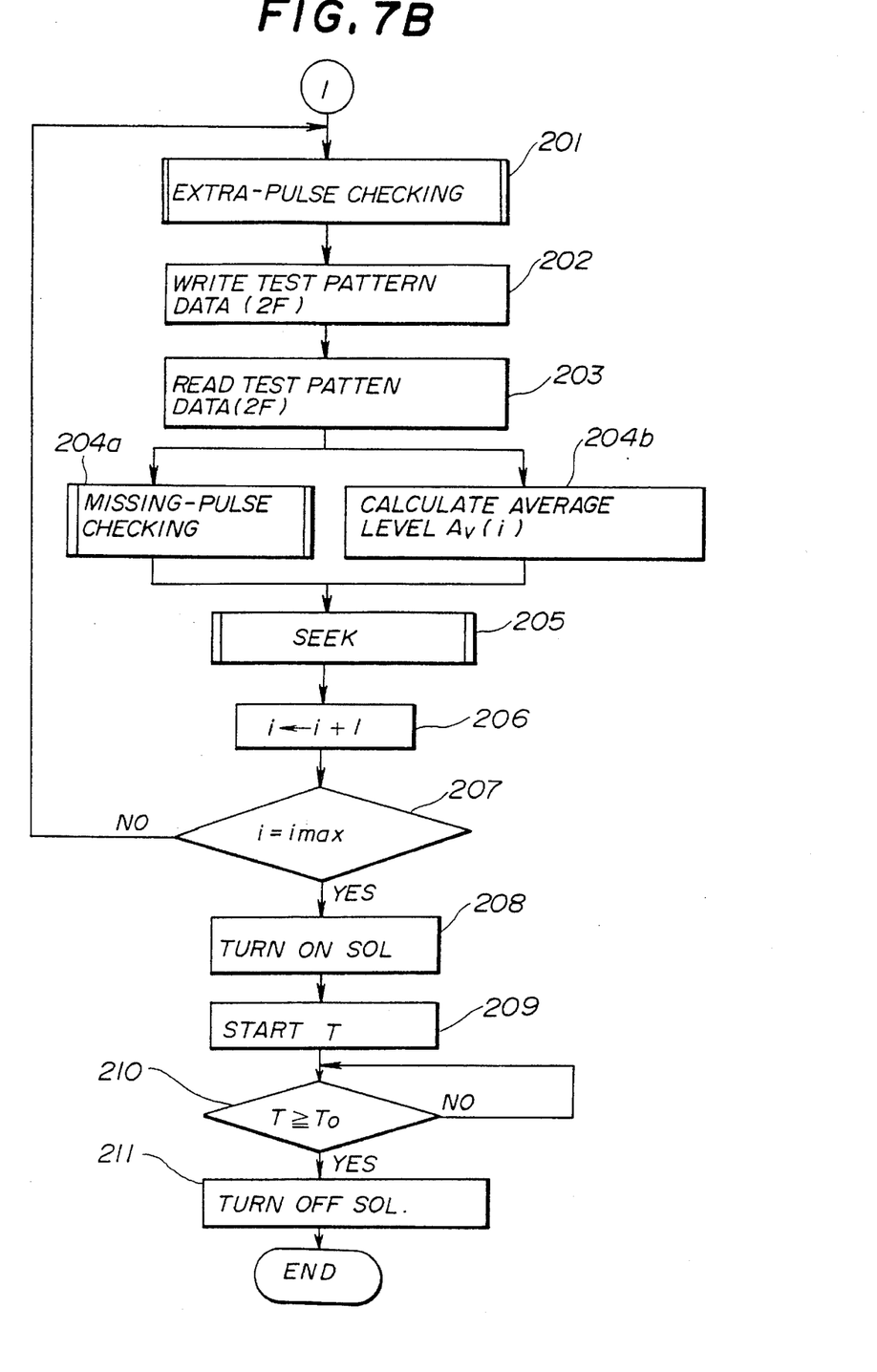

The tester checks whether or not defects are in the magnetic disk 21, in accordance with processes as shown in FIGS.7A and 7B. The processes shown in FIGS.7A and 7B are executed in accordance with instructions from the CPU 32.

FIG. 7A shows an initial process. Referring to FIG. 7A, a register is initialized, in step 101, so that an initial number $i_o$ (e.g. $i_o$=0) is stored in the register. The number i stored in the resistor indicates an ID number for a track of the magnetic disk 21. In step 102, the test pattern data having a predetermined frequency (e.g. the maximum frequency 2F) is written on the i-th track identified by the number i (=$i_o$) stored in the register. After this, the test pattern data is read out from the i-th track of the magnetic disk 21, in step 103, and a read signal corresponding to the test pattern data read out is supplied to the digital signal processor 30. In step 104, the digital signal processor 30 calculates an average level Av(i) of the read signal in the i-th track. The average level Av(i) is stored in a memory of the CPU 32. After the average level Av(i) of the read signal is obtained, the solenoid valve 38 is turned on, in step 105, and, in step 106, a timer T starts. When the solenoid valve 38 is turned on, the magnet rod 34 is moved to the first position P1 by the air cylinder 35. When the magnetic disk 21 is rotated in the state where the magnet rod 34 is maintained at the first position P1, all the information including the test pattern data on the i-th track is erased from the magnetic disk 21. After the timer T starts, in step 107, it is determined whether or not the timer T reaches a predetermined time $T_o$. When the timer T reaches the predetermined time $T_o$, in step 108, the solenoid valve 38 is turned off. The magnet rod 34 is thus returned to the second position P2. The time $T_o$ must be a time for which the magnetic disk 21 is rotated by at least one revolution.

Two revolutions of the magnetic disk 21 are required for writing and reading the test pattern data in steps 102 and 103. Furthermore, at least one revolution of the magnetic disk 21 is required for erasing the information from the whole magnetic disk 21. Thus, during the above initial process, the magnetic disk 21 is rotated by at least three revolutions.

After the initial process, the process shown in FIG. 7B is executed.

Figure 8A:
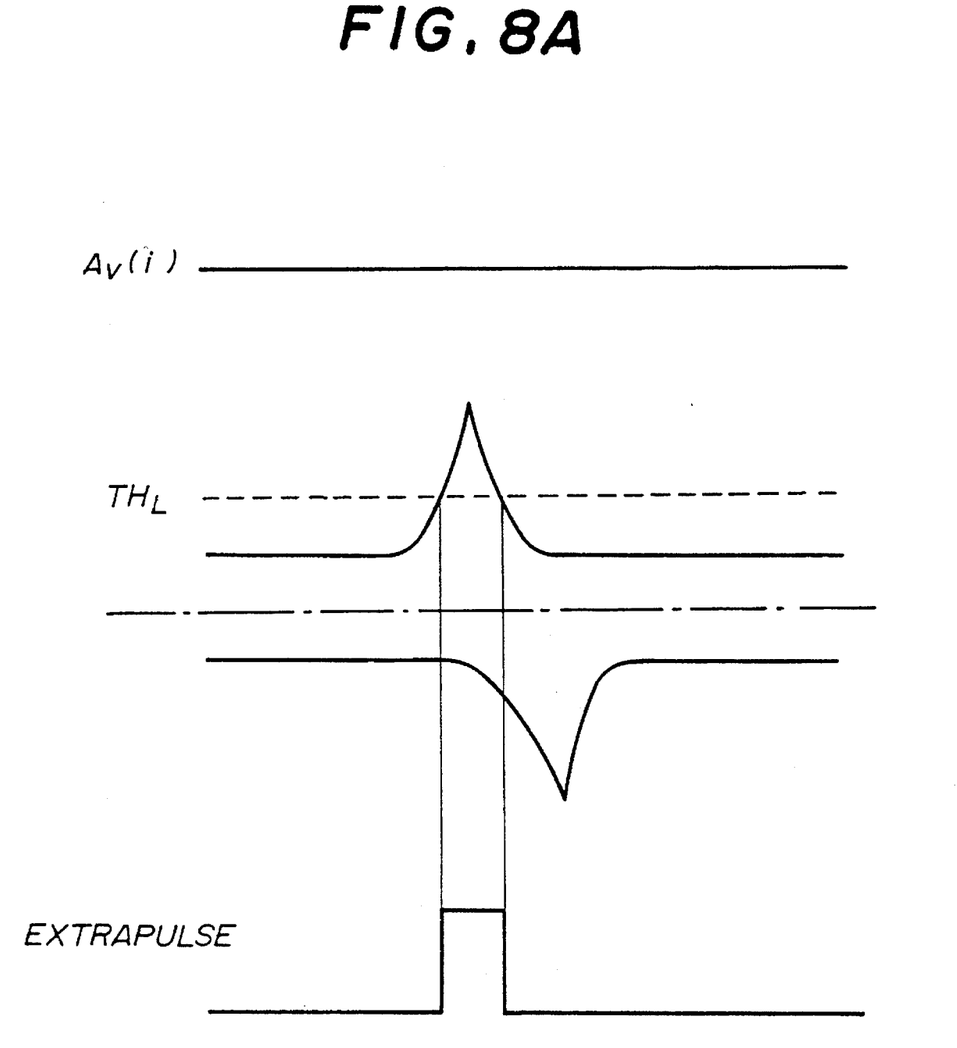
FIGS. 8A and 8B are diagrams illustrating an extra-pulse and a missing-pulse.
Figure 8B:
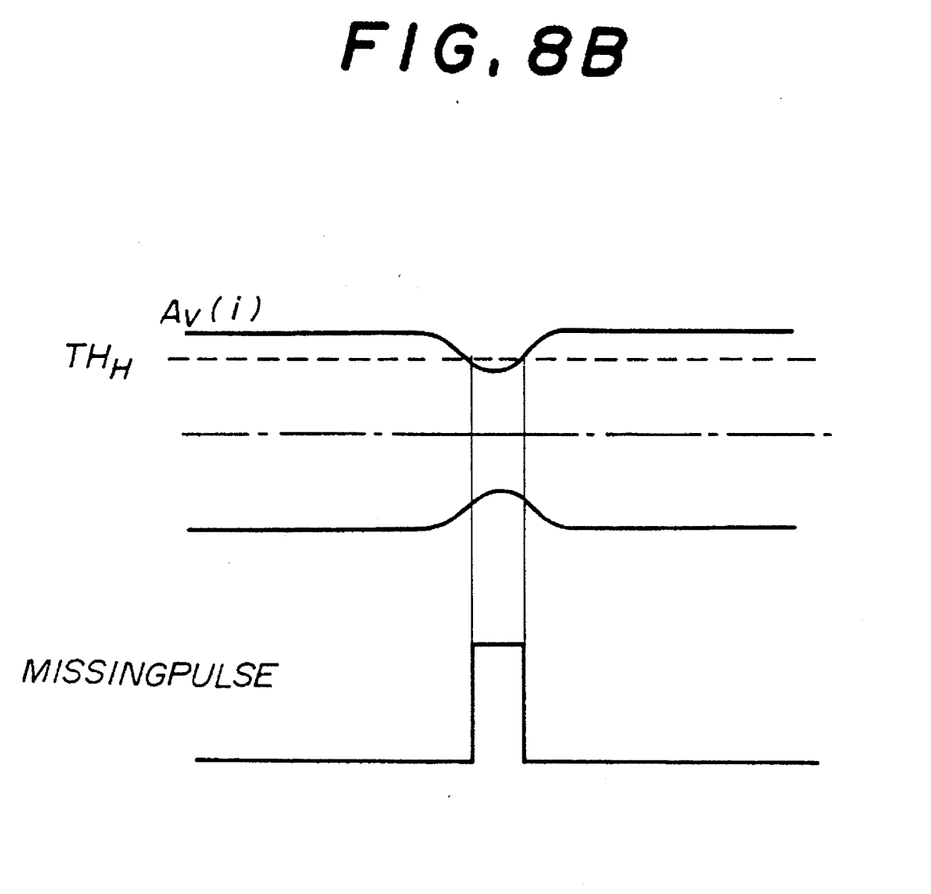

Referring to FIG. 7B, in step 201, it is checked, regarding the i-th track, whether or not an extra-pulse is to be generated. A signal is read out from the i-th track of the magnetic disk 21 from which the information has been erased in steps 105 through 108 shown in FIG. 7A. The digital signal processor 30 compares the signal read out from the i-th track with a threshold level $TH_L$. When the level of the signal is greater than the threshold level $TH_L$, the digital signal processor 30 generates the extra-pulse, as shown in FIG. 8A. The threshold level $TH_L$ is calculated based on the average level Av(i) calculated in step 104 in the initial process shown in FIG. 7A. The threshold level $TH_L$ is, for example, 25% of the average level Av(i). If it is determined, in step 201, that the extra-pulse is generated, it is detected that there is a defect in the i-th track. After this, the test pattern data is written on the i-th track again, in step 202. The test data is then read from the i-th track, in step 203. The read signal corresponding to the test data obtained in step 203 is used in steps 204a and 204b. In step 204a, it is determined, regarding the i-th track, whether or not a missing-pulse is to be generated. The digital signal processor 30 compares the read signal corresponding to the test pattern data with a threshold level $TH_H$. When the level of the read signal is less than the threshold level $TH_H$, the digital signal processor 30 generates a missing-pulse as shown in FIG. 8B. The threshold level $TH_H$ is calculated based on the average level Av(i) calculated in step 104 in the initial process shown in FIG. 7A. The threshold level $TH_H$ is, for example, 65% of the average level Av(i). If it is determined, in step 204a, that the missing-pulse is to be generated, it is detected that there is a defect in the i-th track. In step 204b, the average level Av(i) of the read signal obtained in step 203 is calculated. The average level which has been obtained in step 104 in the initial process and stored in the memory of the CPU is updated to the average level Av(i) obtained in step 204b. The average level Av(i) is used for generating the extra-pulse and the missing-pulse in the next cycle.

After this, the seek operation is performed, in step 205, so that the magnetic head 24 is moved to the next track (the (i+1)-th track). The register is incremented by one, in step 206, so that the number (i+1) indicating the ID number for the (i+1)-th track is set in the register. It is then determined, in step 207, whether or not the register has reached the maximum number $i_{max}$ corresponding to the last track of the magnetic disk 21. When the register has not reached the maximum number $i_{max}$, the above steps 201 through 207 are carried out for the (i+1)-th track. After this, steps 201 through 207 are repeated until the processes are completed for the last track (the $i_{max}$-th track). When the processing for the last track is completed, the solenoid valve 28 is turned on and off, and the magnet rod 34 is maintained at the first position P1 for the time T (steps 208 through 211). As a result, the test pattern data written on all the tracks is erased therefrom by the magnet rod 34.

According to the above embodiment, all the information is erased from the magnetic disk in the initial process shown in FIG. 7A. As a result, step for erasing the information from every track can be omitted from the processes for detecting defects of the magnetic disk. In the processes shown in FIG. 7B, one revolution of the magnetic disk 21 is required in each of steps 201, 202, 203 (204a and 204b) and 205. Thus, the processes for detecting defects in each track can be completed in a time corresponding to four revolutions of magnetic disk 21. In the conventional tester, at least five revolutions of the magnetic disk are required for detecting defects in each track. Thus, as the initial process is carried out only for the initial track, the processing time in the processes for detecting the defect of the magnetic disk can be shortened by about 20% (⅕).

The present invention is not limited to the aforementioned embodiments, and variations and modifications may be made without departing from the scope of the claimed invention.

What is claimed is:

1. A method for detecting defects of a revolving magnetic disk comprising the steps of:

(aa) obtaining, through initializing processing, reference data from said magnetic disk;

(a) erasing, during a single revolution of said magnetic disk, all the information from said whole magnetic disk; and (b) testing, using said reference data, for every track, whether or not a defect is present on said magnetic disk, after said step (a).

2. A method as claimed in claim 1, wherein said step (a) erases information from said whole magnetic disk using a magnet.

3. A method as claimed in claim 2, wherein said step (a) comprises the steps of:

(a-1) making said magnet face said magnetic disk;

(a-2) removing said magnet, after said step (a-1), from a position at which said magnet faces said magnetic disk.

4. A method as claimed in claim 3, wherein said step (a-2) includes a step of:

determining whether or not a predetermined time has passed from the start of said step (a-1), said magnet being removed from the position at which said magnet faces said magnetic disk when said step determines that the predetermined time has passed from the starting of said step (a-1).

5. A method as claimed in claim 4, wherein the predetermined time corresponds to one revolution of said magnetic disk.

6. An apparatus for detecting defects of a revolving magnetic disk comprising:

reference data obtaining means for obtaining reference data, through initializing processing, from said magnetic disk;

erasing means for erasing, during a single revolution of said magnetic disk, information from said whole magnetic disk; and testing means for testing, using said reference data, in every track, whether or not a defect is present on said magnetic disk from which all the information has been erased by said erasing means.

7. An apparatus as claimed in claim 6, wherein said erasing means comprises:

a magnet;

a mechanism for making said magnet face said magnetic disk and for removing said magnet from a position at which said magnet faces said magnetic disk; and control means for controlling said mechanism so that said magnet faces said magnetic disk for a predetermined time.

8. An apparatus as claimed in claim 7, wherein said control means includes timer means for determining whether or not the predetermined time has passed wherein, when said timer means determines that the predetermined time has passed said control means controls said mechanism to remove the magnet from the position at which said magnet faces said magnetic disk.

9. An apparatus as claimed in claim 7, wherein the predetermined time corresponds to one revolution of said magnetic disk.

10. An apparatus for detecting defects of a revolving magnetic disk comprising:

erasing means for erasing, during a single revolution of said magnetic disk, information from said whole magnetic disk; and testing means for testing, in every track, whether or not a defect is present on said magnetic disk from which all the information has been erased by said erasing means;

writing means for writing test pattern data having a predetermined frequency on a first track of said magnetic disk before erasure of information from said magnetic disk by said erasing means;

reading means for reading said test pattern data from the first track and outputting a read signal corresponding to said test pattern data before erasure of the information from said magnetic disk by said erasing means; and data making means for calculating reference data depending on an amplitude of the read signal output from said reading means, the reference data calculated by said data making means being used for detecting a defect in the first track in said testing means.

11. An apparatus as claimed in claim 10, wherein said data making means calculates an average level of the read signal as the reference data.

12. A method for detecting defects of a revolving magnetic disk comprising the steps of:

(a) erasing, during a single revolution of said magnetic disk, all information from said whole magnetic disk;

(b) testing, for every track, whether or not a defect is present on said magnetic disk, after said step (a);

(c) writing test pattern data having a predetermined frequency on a first track of said magnetic disk;

(d) reading said test pattern data from the first track and obtaining a read signal corresponding to said test pattern data; and (e) calculating reference data depending on an amplitude of the read signal obtained in step (d), said steps (c), (d) and (e) being performed before said step (a), the reference data calculated in said step (e) being used for testing for a defect in the first track in said step (b).

13. A method as claimed in claim 12, wherein said step (e) calculates an average level of the read signal as the reference data.

14. A method as claimed in claim 12, wherein said step (b) comprises the steps of:

(b-1) checking for the presence of a first defect on the first track based on a first threshold calculated from the reference data calculated in said step (e);

(b-2) writing test pattern data having a predetermined frequency on the first track of said magnetic disk;

(b-3) reading said test pattern data from the first track and obtaining a read signal corresponding to said test pattern data;

(b-4) checking for the presence of a second defect on the first track based on a second threshold calculated from the reference data calculated in said step (e);

(b-5) obtaining reference data depending on the amplitude of the read signal obtained in step (b-3); and (b-6) performing a seek operation so that the next track will be tested, repeating said steps (b-1) through (b-6), the reference data obtained in step (b-5) being substituted for that calculated in step (e) in the repeat of steps (b-1) through (b-6).

* * * * *